United States Patent [19]

Demmer

[11] Patent Number: 4,694,326

[45] Date of Patent: Sep. 15, 1987

[54] DIGITAL PHASE LOCKED LOOP STABILIZATION CIRCUITRY INCLUDING A SECONDARY DIGITAL PHASE LOCKED LOOP WHICH MAY BE LOCKED AT AN INDETERMINATE FREQUENCY

[75] Inventor: Walter H. Demmer, Plainsboro Township, Middlesex County, N.J.

[73] Assignee: RCA Corporation, Princeton, N.J.

[21] Appl. No.: 845,698

[22] Filed: Mar. 28, 1986

[51] Int. Cl.[4] .............................................. H04N 9/45
[52] U.S. Cl. ........................................ 358/19; 358/23
[58] Field of Search .................... 358/13, 19, 23, 21 R

[56] References Cited

U.S. PATENT DOCUMENTS

| | | | |
|---|---|---|---|
| 3,578,902 | 5/1971 | Monsay | 178/5.4 |
| 4,349,833 | 9/1982 | Clarke | 358/23 |
| 4,476,490 | 10/1984 | Kaneko | 358/148 |
| 4,488,170 | 12/1984 | Nillesen | 358/26 |
| 4,500,404 | 2/1985 | Machida | 358/17 |
| 4,504,799 | 3/1985 | Elmis et al. | 331/1 A |
| 4,506,175 | 3/1985 | Reitmeier et al. | 307/525 |

FOREIGN PATENT DOCUMENTS 3432314  3/1986  Fed. Rep. of Germany ........ 358/19

OTHER PUBLICATIONS

Gruen, Wolf J. Theory of AFC Synchronization Proceedings of the IRF Aug. 1953, pp. 1043-1048.

"Digital Video Signal Processing", Philips Publication 9398 332 60011, Feb. 1986.

Primary Examiner—John W. Shepperd
Attorney, Agent, or Firm—E. M. Whitacre; P. J. Rasmussen; K. N. Nigon

[57] ABSTRACT

A digital television receiver includes a first phase locked loop which develops a sampling clock signal that is locked to the horizontal line synchronizing signals components of a composite video signal. A second digital phase locked loop is clocked by the sampling clock signal and develops a digital signal that is phase locked to the color burst signal. This signal is used as a regenerated color subcarrier signal to synchronously demodulate the chrominance components of the composite video signal into I and Q color difference signals. To compensate for frequency instabilities in the regenerated subcarrier signal caused by frequency instabilities in the line-locked clock signal, a third digital phase locked loop develops an oscillatory signal which is phase locked to a reference signal generated by a crystal controlled oscillator. Control signals from the third phase locked loop are applied to circuitry which develops control signal that is independent of the crystal frequency. This control signal is applied to the second phase locked loop to substantially compensate for frequency instabilities related to the clock signal. Since the control signal applied to the second phase locked loop is independent of the frequency of the control, there is no need for manual adjustment of the crystal oscillator.

13 Claims, 7 Drawing Figures

DISCRETE TIME OSCILLATOR

DIGITAL PHASE LOCKED LOOP STABILIZATION CIRCUITRY INCLUDING A SECONDARY DIGITAL PHASE LOCKED LOOP WHICH MAY BE LOCKED AT AN INDETERMINATE FREQUENCY

This invention relates to circuitry for reducing frequency instability in a digital phase locked loop that is controlled by a clock signal which may be unstable.

A digital phase locked loop (PLL) includes a variable digital oscillator which generates oscillatory signals that may be locked in frequency and phase to a reference signal. The frequency and phase of the signal produced by the digital PLL may depend on the frequency of the clock signal applied to the digital oscillator as well as on the frequency and phase of the reference signal.

For example, consider the digital phase locked loop used to regenerate the chrominance subcarrier signal in a line-locked digital television receiver. An exemplary system of this type is described in U.S. Pat. No. 4,349,833 entitled "Apparatus For Digital Demodulation or Modulation of Television Chrominance Signals", which is hereby incorporated by reference. Briefly, the system includes a discrete time oscillator (DTO), similar to the one shown in FIG. 1A for regenerating a digital chrominance subcarrier signal locked in phase to the color reference burst component of the composite video signal. The oscillator has three components, an adder 10, accumulator register 20 and a read only memory (ROM) 30. The value held by the accumulator register is incremented by an input signal, In, coincident with the leading edge of each pulse of the clock signal, CK. The output values of the accumulator register 20 are applied as addresses to the ROM 30. ROM 30 is programmed to provide a periodic output function, for example, samples of a sine wave, as an output signal, Out, in response to the address values provided by the accumulator register. Assuming that M-1 is the largest value which may be held in the accumulator register 20, and that an increment signal, In, is applied to the DTO. The frequency of the signal produced by the DTO ($f_{DTO}$) may be expressed as:

$$f_{DTO} = (IN/M)f_{CK}. \quad (1)$$

Examples of the signals V and Out developed by the DTO when IN/M=¼ are shown in FIGS. 1B and 1C respectively. The points on the sinusoidal waveform shown in FIG. 1C represent the output values provided by the ROM 30 responsive to the addresses, V, (shown in FIG. 1B) developed in the accumulator register 20.

When a DTO is used in a digital PLL, the range of values which may be held in the accumulator register (i.e. the modulus of the accumulator) and the frequency of a clock signal, $f_{CK}$, are assumed to be invariant so that the frequency of the signal provided by the DTO may be changed only by changing the increment value, IN, applied to the input terminal of the DTO. In the U.S. Pat. No. 4,349,833 referenced above, the input signal applied to the DTO is determined by the detected phase difference between the reconstructed color subcarrier signal produced by the DTO and the color reference burst signal component of the received video signals. This phase difference signal is applied to a low-pass filter, the output signals of which are used to change the input value to the DTO so that the frequency and phase of the signal provided by the DTO remain locked to the burst signal.

As set forth above, a basic assumption for this type of digital PLL is that the clock frequency is invariant. This assumption may not be valid if the clock signal is generated by a PLL which locks to the horizontal line synchronizing signal components of the input video signals (a line locked PLL) and if the input video signals are derived from a nonstandard source such as a video tape recorder (VTR) or video disc player. The signal provided by a non-standard source generally has relatively stable color burst signal components but may have horizontal line synchronizing signal components which vary significantly in frequency or phase from line to line. This variation may be caused by stretching of the tape, defects in the disc, or motor speed variations in either the VTR or disc player. The frequency of the clock signal generated by a line locked PLL will change to track the changes in the frequency of the horizontal line synchronizing signal. The time constant of the PLL which generates the line locked clock signal is generally relatively short, on the order of ten or fifteen horizontal line periods, for example. This relatively short time constant allows the system to track the changing line frequency rapidly, to keep the number of samples per line substantially constant throughout a field or frame. This feature is desirable in television signal processing systems which include field or frame store memories.

However, this tracking feature may cause sufficient variation in the frequency of the clock signal to cause significant color signal distortion in television systems which use a digital PLL to regenerate the color subcarrier signal.

The color subcarrier frequency for composite video signals is relatively stable since it is generated by a crystal controlled oscillator either at the transmitter or in the VTR or disc player. The color information in the video signal is quadrature amplitude modulated with respect to this color subcarrier frequency. To demodulate this signal, it is desirable for the regenerated subcarrier signal developed by the PLL to closely match the original subcarrier signal in frequency and phase. Since the color subcarrier signal is suppressed in a standard composite video signal, the PLL which regenerates the color subcarrier signal locks to the color reference burst components of the video signals. These components occur only during a small portion of each horizontal line. Consequently, it is desirable for the color subcarrier PLL to accumulate phase errors over a relatively large number of horizontal line periods to ensure that any measured phase error is accurate and uncontaminated by noise in the video signal. Thus, the color subcarrier PLL preferably has a much longer time constant than the line locked PLL which generates the system clock signal. This time constant may be on the order of one frame period, for example.

Because of the difference in the loop time constants and because the frequency of the signal produced by the digital color subcarrier PLL depends on the frequency of the clock signal, the combination of the two PLL's may cause instabilities in the regenerated color subcarrier signal. This instability may even cause the color subcarrier PLL to lock at the wrong frequency.

SUMMARY OF THE INVENTION

The present invention is circuitry to stabilize the frequency of a signal generated by a first digital PLL that is clocked by a signal having frequency instabilities.

The circuitry includes an oscillator which generates a reference signal having substantially invariant frequency. The output signal of the oscillator is applied to a second digital PLL which includes a phase detector. The phase detector compares the signal developed by the oscillator against a signal developed by the DTO and provides a signal representing the difference in phase between the two signals. This phase difference signal is applied to circuitry which develops a compensating control signal representing the changes in the frequency of the clock signal with respect to a nominal clock frequency. The compensating control signal is substantially independent of the frequency of the reference signal. This signal is applied as a correction signal to the first digital PLL to substantially eliminate frequency instabilities related to the clock signal.

DETAILED DESCRIPTION

Figure 1A:
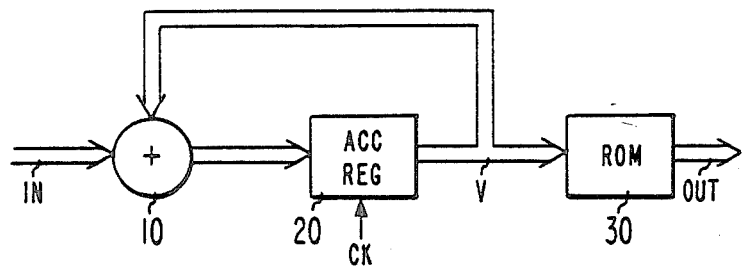
FIG. 1A (prior art) is a block diagram of a discrete time oscillator and FIGS. 1B and 1C are waveform diagrams useful in explaining the operation of a discrete time oscillator.
Figure 1B:
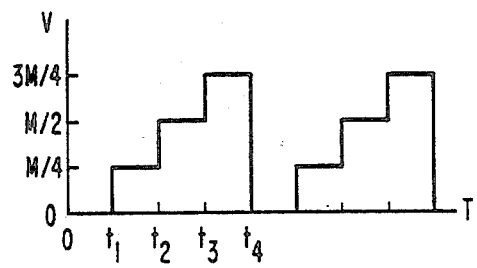
Figure 1C:
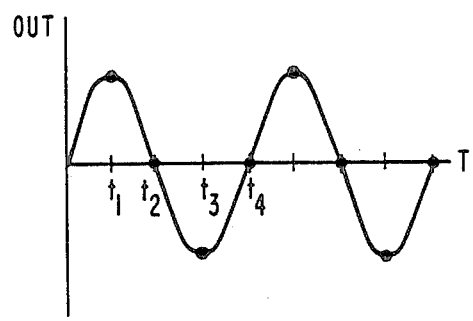

In the drawings, broad arrows represent busses for multiple-bit parallel digital signals and line arrows represent connections carrying analog signals or single bit digital signals. Depending on the processing speed of the devices, compensating delays may be required in certain of the signal paths. One skilled in the art of digital circuit design would know where such delays would be needed in a particular system.

Figure 2:
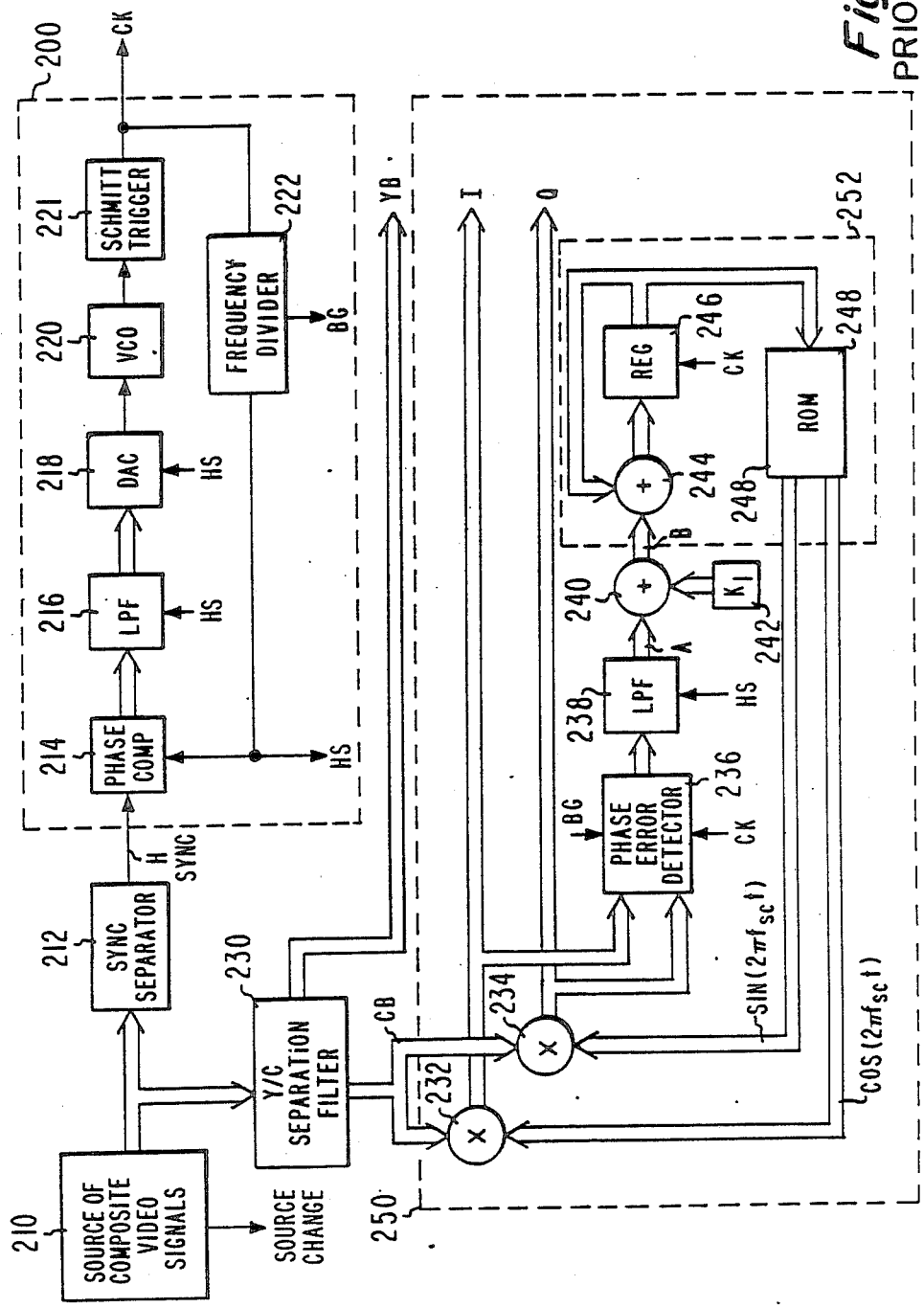
FIG. 2 (prior art) is a block diagram of a portion of a digital television receiver.

FIG. 2 is a block diagram of a portion of a television signal processing system which includes first and second PLL's 200 and 250 respectively. The PLL 200 develops a sampling clock signal, CK, which is phase locked to the horizontal line synchronizing signal components of the incoming video signal. The PLL 250 is a digital PLL, clocked by the sampling clock signal CK, which develops digital signals representing the color subcarrier signal at a predetermined phase and a signal that is quadrature phase related to this signal. These two signals are used to synchronously demodulate the chrominance signal components of the incoming video signals to develop two quadrature phase related color difference signals.

In FIG. 2, a source of composite video signals 210, which may include, for example, the tuner, IF amplifier, video detector and analog to digital converter of a conventional digital television receiver, provides digitized composite video signals to sync separator circuitry 212. The source 210 also provides a signal, SOURCE CHANGE, which indicates when a new source of composite video signals has been selected (e.g. when the channel has been changed on the tuner). The sync separator circuitry 212, for example, develops a signal, HSYNC, representing the horizontal line synchronizing signal component of the composite video signals. The signal HSYNC is applied to one input terminal of a phase comparator 214. An internally generated horizontal line synchronizing signal, HS, is applied to a second input terminal of the phase comparator 214. The circuitry which develops the signal HS is described below. Phase comparator 214 may, for example, be similar to the circuitry described in U.S. Pat. No. 4,506,175 entitled "Digital Phase Comparator Circuit Producing Sign and Magnitude Outputs" which is hereby incorporated by reference. The signal provided by the phase comparator 214 may be, for example, the time delay between the leading edges of the respective pulse signals HSYNC and HS. This signal has positive values when the leading edges of the HSYNC pulses occur before the leading edges of the HS pulses and negative values when the leading edges of the HSYNC pulses occur after the leading edges of the HS pulses.

Figure 4:
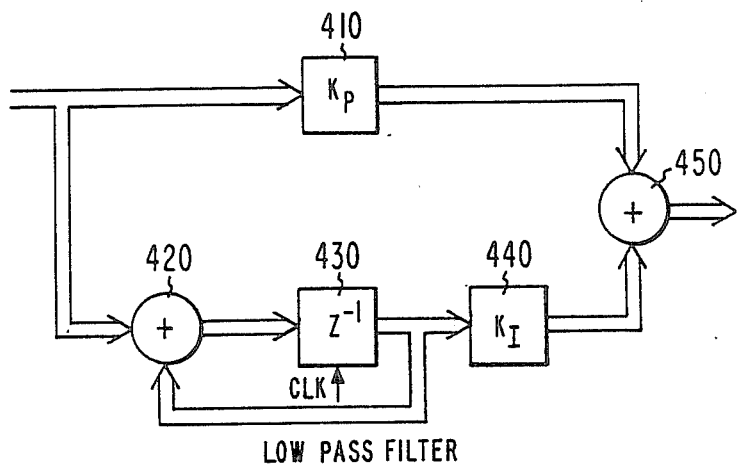
FIG. 4 (prior art) is a block diagram showing the structure of exemplary low-pass filters for use in FIGS. 2 and 3.

The signal provided by the phase comparator circuitry 214 is applied to a low-pass filter 216. Filter 216 is the loop filter of the PLL 200. An exemplary structure for this filter is shown in FIG. 4. In FIG. 4, input signals are applied to a scaling circuit 410 which multiplies the input values by a scale factor $K_p$. The digital signals developed by the scaling circuit 410 are applied to one input port of an adder 450. The input signals to the filter are also applied to one input port of an adder 420 which, with the delay element 430, forms an integrator. The output port of the adder 420 is connected to the input port of the delay element 430, the output port of which is connected to the second input port of the adder 420. Delay element 430 may be, for example, a synchronous latch that is clocked by a signal CLK (i.e., the horizontal line synchronizing signal HS) to provide a sample delay interval of one period of the signal CLK. The signal provided by the delay element 430 is the integrated input signal (i.e. the integrated phase difference between HSYNC and HS). This signal is applied to a scaling circuit 440 which multiplies the integrated signal by a factor $K_I$. The output signal of the scaling circuit 440 is applied to the second input port of the adder 450. The signal developed by the adder 450 is the output signal of the low-pass filter. The low-pass filter shown in FIG. 4 is a digital embodiment of a conventional proportional plus integral control network where the factors $K_P$ and $K_I$ correspond to the proportional gain and the integral gain of the network respectively. The values of the factors $K_P$ and $K_I$ depend on the desired time constant and damping factor of the PLL and upon the gains of the other elements in the loop. Filters of this type are commonly used as loop filters in PLL's.

Referring to FIG. 2, the low-pass filtered phase difference signals provided by the filter 216 are applied to a digital to analog converter (DAC) 218. DAC 218 develops analog potential values representing the filtered phase difference signals and applies these values at a horizontal line rate to a voltage controlled oscillator (VCO) 220. The VCO 220, which may be of conventional design, produces the sampling clock signal CK. VCO 220 is tuned to have a free running frequency of R times $f_H$. In the present embodiment, R is the ordinal number of a harmonic of the horizontal line frequency, $f_H$, which approximates a multiple of the color subcarrier frequency. For example, in the NTSC system, the frequency, $f_{SC}$, of the color subcarrier signal is the 455th harmonic of one-half of the horizontal line frequency, and the frequency, $f_{ck}$, of the sampling clock signal is four times the frequency of the color subcarrier signal, 4 $f_{SC}$. So the VCO used in this embodiment has a free-running frequency of approximately 910 times the horizontal line frequency (R=910).

The sinusoidal output signal of the VCO is applied to Schmitt trigger circuitry 221 which develops a square wave clock signal CK having a frequency, $f_{CK}$, equal to $Rf_H$. The signal CK is applied to frequency dividing circuitry 222. Circuitry 222 divides the frequency of the signal CK by R to develop a signal HS having a frequency substantially equal to $f_H$. As set forth above, the signal HS is applied to the second input terminal of the phase comparator 214.

The circuitry 222 may, for example, include a 10-bit counter (not shown) which is configured to be reset when a count value of 910 is achieved. The frequency dividing circuitry 222 may further include circuit elements (not shown) coupled to the counter to detect count values corresponding to the beginning and end of the burst interval and for generating a burst gate signal, BG, which spans the time interval defined by those count values in each horizontal line period.

The PLL 200 generates a clock signal, CK, which tracks the varying line frequency of a non-standard signal to provide a substantially uniform number of sampling clock pulses per line. In the present embodiment, the gain factors of the phase comparator 214, low-pass filter 216, DAC 218, VCO 220, Schmitt trigger 221 and frequency divider circuitry 222 are selected to achieve a filter time constant of approximately 15 horizontal line periods and a damping factor of 2. These gain values depend on the circuit elements to be used in the PLL and may be readily calculated by one skilled in the art of phase-locked loop design. An explanation of the relationship among the gain values, the damping factor and the PLL time constant may be found in Gruen, W.J. "Theory of AFC Synchronization" Proceedings of the IRE, August 1953, pp. 1043-1048, which is hereby incorporated by reference.

Composite video signals from source 210 are also applied to Y/C separation filter circuitry 230. Circuitry 230 may include, for example, a low-pass filter and a band-pass filter for separating the respective luminance and chrominance signal components from the composite video signals. The luminance and chrominance signals are available at the output busses YB and CB of the circuitry 230 respectively.

The separated chrominance components are applied to multipliers 232 and 234 which, using signals provided by the PLL 250, demodulate the chrominance signals into two quadrature phase related baseband color difference signals, for example, I and Q.

The color difference signals are applied to a phase error detector 236. The phase error detector 236 develops an output signal representing the difference between the phase of the demodulated color reference burst signal and a reference phase value. The phase error detector 236 may include, for example, circuitry (not shown) to separately accumulate baseband I and Q sample values during the burst interval and to divide the accumulated I values by the accumulated Q values to develop values representing the phase of the burst signal relative to the sampling instants of the I and Q samples. These values may be subtracted from a reference value representing the desired burst phase to generate a phase error value to control the PLL 250. The phase error values developed by the detector 236 are applied to a low-pass filter 238. Filter 238 is clocked by the signal HS generated by the PLL 200 and may be similar to the filter 216 except for the values of the proportional and integral gain factors, $K_P$ and $K_I$ respectively. The filtered phase error signal, A, provided by the filter 238 is applied to one input port of an adder 240. A fixed increment value, $K_1$, supplied by a source 242, is applied to the other input port of the adder 240. The signal, B, developed by the adder 240 is applied as the input increment value or frequency control value to a DTO 252 which includes an adder 244, an accumulator register 246 and a ROM 248 that is programmed to provide, at respective first and second output ports, the cosine and sine of the values applied to its address input port, normalized to $2\pi$ radians. These signals which in the present embodiment are the cosine and sine of $2\pi f_{sc}t$ respectively, are applied to the respective multipliers 232 and 234, as set forth above, to synchronously demodulate the chrominance signal to recover the two quadrature phase related color difference signals.

In the steady state, when there is no difference between the phase value of the demodulated burst signal and the reference phase value, the frequency of the signal developed by the DTO is determined by the number of bits in the accumulator register 246, the increment value $K_1$ supplied by the source 242, and by the frequency of the clock signal CK. Assuming that the register 246 is an twenty-bit register and that the frequency of the clock signal CK is equal to $4f_{SC}$, a $K_1$ equal to 262,144 (i.e. $2^{18}$) produces an output signal having a frequency of $f_{SC}$. In dynamic operation, when the burst phase does not match the reference phase, the phase error values provided by the detector 236 are accumulated by the low-pass filter 238 to develop a correction term which is added to the value $K_1$ by the adder 240 to change the frequency of the DTO in a sense that tends to reduce the phase error.

As set forth above, it is desirable for the time constant of the PLL 250 to be relatively long to reduce the effects of noise and to provide a high level of phase accuracy for the signals applied to the synchronous demodulating multipliers 232 and 234. In the present embodiment, for example, the gain factors of the various circuit elements in the PLL are set to values which produce a loop time constant of approximately one frame period (1/30th of a second for NTSC signals). Since the time constant of the PLL 250 is much longer than the time constant of the PLL 200, the PLL 250 may not be able to track frequency changes in the regenerated subcarrier signal that are induced by changes in the frequency of the clock signal, CK. This deficiency in the system shown in FIG. 2 may cause random errors in the I and Q color difference signals or may cause the PLL 250 to generate a color subcarrier signal having the wrong frequency, locked to the wrong spectral component of the color subcarrier frequency.

To understand this problem more completely, consider the PLL correction signals A and B. When the signals applied to the television receiver are from standard sources (e.g. broadcast signals) and the PLL 250 is locked to the color reference burst signal, the clock signal CK and regenerated subcarrier signal developed by the DTO are at their nominal frequencies, $f_{ck\ nom}$ and $f_{sc\ nom}$ respectively. Accordingly, the equation (1) may be restated as $$IN/M = f_{sc\ nom}/f_{ck\ nom}. \qquad (2)$$

In relation to FIG. 2, the input increment signal, or frequency control signal, In, corresponds to the correction signal B. When the PLL 250 is locked to burst, the signal A is zero valued. In this instance, the input increment signal, B, applied to the DTO 252 is the value $K_1$. Consequently, $$B = K_1 = M\, f_{sc\ nom}/f_{ck\ nom}. \tag{3}$$

In the non-locked condition, the frequency of the signal provided by the DTO 252 differs from $f_{sc\ nom}$ by some value $\Delta f_{sc}$ and the signal A is non-zero. In this instance, the equation (3) becomes:

$$B = A + D_1 = M(f_{sc\ nom} + \Delta f_{sc})/f_{ck\ nom}. \tag{4}$$

from which it may be deduced that:

$$A = M\Delta f_{sc}/f_{ck\ nom}. \tag{5}$$

B is the input increment signal to the DTO. Substituting the equation (4) in the equation (1) yields:

$$f_{DTO252} = (f_{sc\ nom} + \Delta f_{sc})f_{ck}/f_{ck\ nom}. \tag{6}$$

Thus, even when the PLL 250 has locked to the color burst signal and the term $\Delta f_{sc}$ becomes zero, the frequency of the signal generated by the DTO 252 may change by the factor $f_{ck}/f_{ck\ nom}$, the actual clock frequency divided by the nominal clock frequency.

Figure 3A:
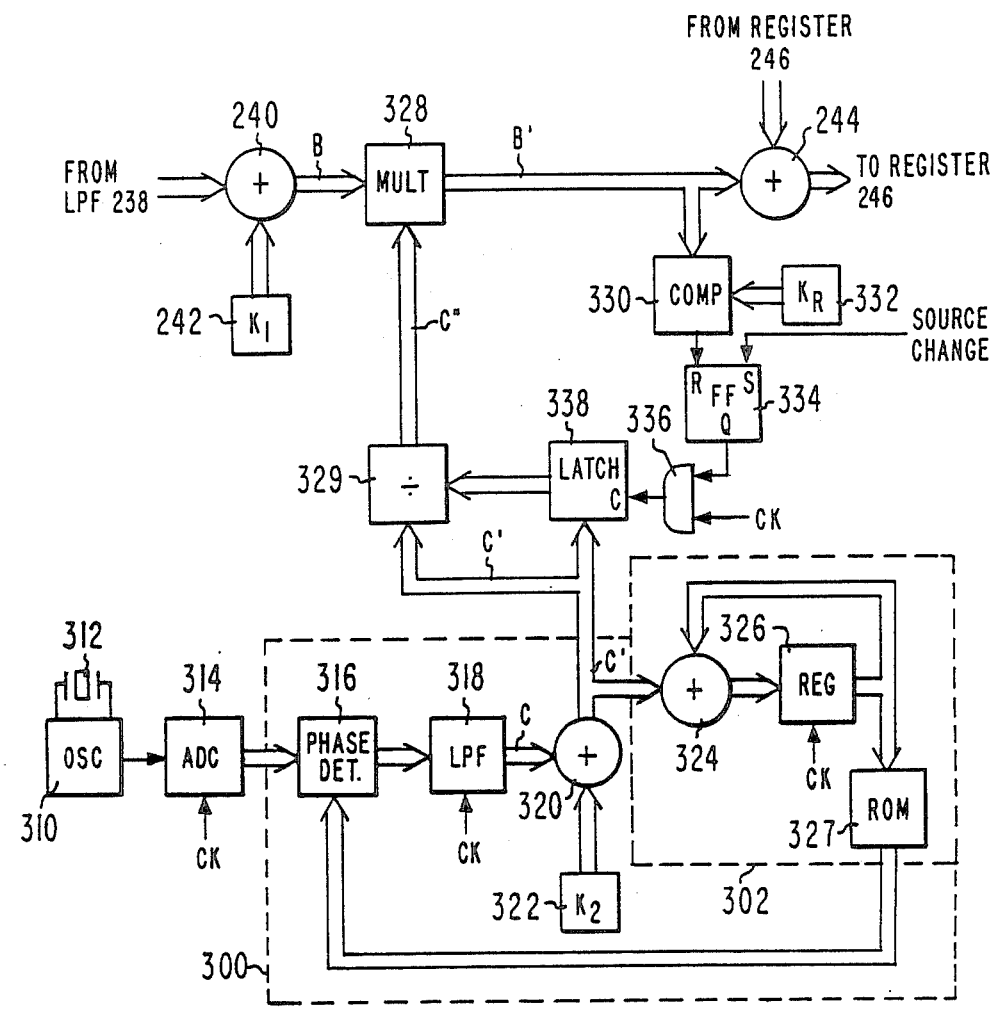
FIG. 3A is a block diagram of circuitry embodying the present invention which may be used with the portion of the television receiver shown in FIG. 2.

FIG. 3A is a block diagram of circuitry which embodies the present invention. This circuitry modifies the signal B to develop a signal B' which is an input increment signal that allows the signal generated by the DTO 252 to be substantially independent of changes in $f_{ck}$.

The circuitry includes an oscillator 310 which develops a sinusoidal reference signal having a frequency $f_{xtl}$ determined by the resonant crystal 312. The output signal of the oscillator is applied to an analog-to-digital converter (ADC) 314. ADC 314, which may, for example be a four-bit flash ADC, samples the sinusoidal signal at instants determined by the clock signal CK to develop digital signals representing the reference signal. The frequency of the reference signal is not important for reasons set forth below. It is desirable, however, for this frequency to remain substantially invariant while the receiver is operating and for the frequency to be less than one-half of $f_{ck}$ to satisfy the Nyquist criteria.

The digital signal provided by the ADC 314 is applied to a phase detector 316 which is part of a PLL 300. In addition to the phase detector 316, the PLL 300 also includes a low-pass filter 318, adder 320, digital value source 322, and a DTO 302 which includes an adder 324, an accumulator register 326 and a ROM 327. This PLL develops, for example, a four-bit digital signal at the output port of the ROM 327 that is locked in frequency and phase to the reference signal provided by the oscillator 310. The phase detector 316 compares the signal provided by the ROM 327 to the signal provided by the ADC 314. After the PLL 300 has initially locked to the reference signal, the phase difference signal developed by the phase detector 316 represents phase changes induced by the clock signal, CK. This phase difference signal is applied to a low-pass filter 318. Filter 318 is the loop filter of the PLL 300 and may, for example, be of the same design as the filters 216 and 328 described above. The integral and proportional gain factors of the filter 318 are set, along with the gain constants of the other elements in the loop to provide a loop time constant that is less than or approximately equal to the time constant of the PLL 200 (i.e. fifteen horizontal line periods). The filtered phase difference signal provided by the filter 318 is added to a fixed digital value, $K_2$, from a source 322, by the adder 320. The signal provided by the adder 320 is applied as the input increment signal to the DTO 302 as set forth above. The output signal of the DTO 302 is applied to the phase detector 316 to complete the feedback loop.

The following is a more detailed analysis of the operation of the PLL 300. The frequency, $f_{xtl}$, of the reference signal is substantially invariant since it is generated by a crystal controlled oscillator. Consequently, the phase difference signals developed by the phase detector 316 and the phase correction signals developed by the low-pass filter 318 are proportional to the frequency and phase differences in the signal generated by the DTO 302 relative to the signal produced by the crystal oscillator. These frequency and phase differences are induced by the frequency instabilities in the clock signal CK. Thus, when the signals received via source 210 are from standard sources, the output signal C of the low-pass filter 318 is zero valued and the input increment signal to the DTO 302 is the digital value $K_2$ provided by the source 322. Using analysis similar to that set forth above in reference to the PLL 250, the value $K_2$ may be described by the equation (7).

$$K_2 = Nf_{xtl}/f_{ck\ nom} \tag{7}$$

where the number N is one greater than the largest number that can be stored in the accumulator register 326.

When the signals received via the source 210 are from non-standard sources, however, the frequency of the clock signal CK may vary from the nominal value $f_{ck\ nom}$ by an amount $\Delta f_{ck}$, so the signal C provided by the filter 318 is non-zero. In this instance, the input increment signal or frequency control signal C', applied to the DTO 302 becomes $C + K_2$ and the frequency of the clock signal becomes $f_{ck\ nom} + \Delta f_{ck}$ representing the variation in the clock frequency $f_{ck}$ with respect to the desired nominal clock frequency. The signal C' is described by the equation:

$$C' = C + K_2 = Nf_{xtl}/(f_{ck\ nom} + \Delta f_{ck}). \tag{8}$$

Multiplying the right-hand side of the equation (8) by $f_{ck\ nom}/f_{ck\ nom}$ yields:

$$C + K_2 = Nf_{xtl}f_{ck\ nom}/(f_{ck\ nom} + \Delta f_{ck})f_{ck\ nom}. \tag{9}$$

Replacing the numerator factor, $f_{ck\ nom}$, in the equation (9) by $f_{ck\ nom} + \Delta f_{ck} - \Delta f_{ck}$ yields:

$$C + K_2 = Nf_{xtl}/f_{ck\ nom} - Nf_{xtl}\Delta f_{ck}/(f_{ck\ nom} + \Delta f_{ck})f_{ck\ nom}. \tag{10}$$

From the equation (10), it can be deduced that $$C = -Nf_{xtl}\Delta f_{ck}/(f_{ck\ nom} + \Delta f_{ck})f_{ck\ nom}. \tag{11}$$

Equation 11 describes the frequency difference signal provided by the low-pass filter 318 in response to the phase difference signals provided by the phase detector 316.

The signal C', the sum of C and $K_2$, when applied as the input increment signal to the DTO 302 causes the DTO 302 to accurately track the changes in $f_{ck}$ and, maintain the frequency of the signal provided by the DTO 302 substantially equal to $f_{xtl}$.

The signal C' is applied to the dividend input port of a divider 329 and to a latch 338 which provides signals to the divisor input port of the divider 329. An AND gate 336 is connected to the clock input terminal of the latch 338. The input terminals of the AND gate 336 are coupled to receive the clock signal, CK and a control signal respectively. The AND gate 336 is controlled to selectively store samples of the signal C' into the latch 338 by circuitry which includes a comparator 330, a digital reference value source 332 and a flip-flop 334. The flip-flop 334 is set by the SOURCE CHANGE signal provided by the source of composite video signal 210. This signal sets the flip-flop 334 whenever there is a change in the source of the signal provided by the source 210. This occurs, for example, when the source 210 is switched to provide a nonstandard signal.

Composite video signals from nonstandard sources such as VTR's or video disc players generally appear to be standard signals. The variations in the horizontal line frequency, referred to above, occur at irregular intervals interspersed among intervals during which the video signals have a substantially standard horizontal line frequency. While the flip-flop 334 is set, the values of the signal C' are applied to both inputs of the divider 329, so the output signal, C", provided by the divider 329 is substantially equal to unity. The signal C" multiplies the signal B to produce the input increment signal B' for the DTO 252. The comparator 330 compares, over a predetermined interval, the signal B' against a digital reference value $K_R$ which represents the value of B' when a known standard signal is received. The value of $K_2$ may be set, for example, during the manufacturing process from a calibrated source of reference signal. When the comparator 330 determines that the values of B' equal $K_R$, it resets the flip-flop 334, disabling the AND gate 336 from storing further samples of the signal C' to the latch 338.

Since the input to the latch is disabled when the received signals satisfy the criteria of standard signals (i.e. $f_{ck} = f_{ck\ nom}$) the sample of the signal C' that is stored in the latch 338, $C'_L$, is the value of the frequency control signal, C', when standard signals are received. The value $C'_L$ may be represented by the equation:

$$C'_L = N f_{XTL}/f_{ck\ nom}. \tag{12}$$

Dividing the signal C', defined by equation (8) by the value $C'_L$ yields the signal C" described by the equation:

$$C'' = f_{ck\ nom}/f_{ck}. \tag{13}$$

Multiplying the signal B from the adder 240 by the signal C" in the multiplier 328, produces the corrected input increment signal B' which satisfies the equation:

$$B' = M(f_{sc\ nom} + \Delta f_{sc})/f_{ck}. \tag{14}$$

When B' is applied as the input increment signal of the DTO 252, the equation (6) becomes $$f_{DTO\ 252} = f_{sc\ nom} + \Delta f_{sc} \tag{15}$$

so the frequency of the signal provided by the PLL 250 is substantially independent of the frequency of the clock signal CK.

It is noted, moreover, that the circuitry which generates the correction signal C" is substantially independent of the actual frequency $f_{XTL}$ of the oscillator 310. The factors, $f_{XTL}$, of the signal C' cancel when C' is divided by the sample value stored in the latch 338. Thus, the value of the frequency $f_{XTL}$ is not important but its stability is important so that the stored value $C'_L$ remains valid while it is being used.

Figure 3B:
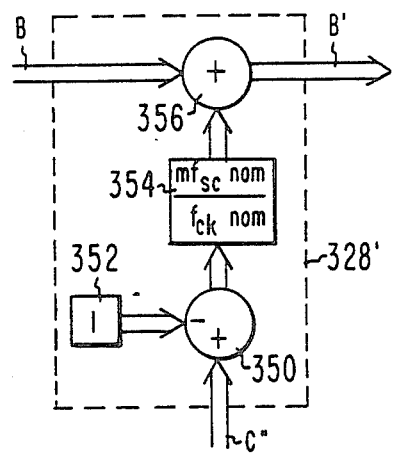
FIG. 3B is a block diagram of alternative circuitry for use with the circuitry shown in FIG. 3A.

The circuitry shown in FIG. 3A may be simplified by replacing the multiplier 328 by the circuitry 328' shown in FIG. 3B. In FIG. 3B, the signal C" is applied to a subtracter 350 which subtracts a unity value, provided by a digital value source 352, from the signal C". The signal provided by the subtracter 350 is multiplied by a digital value substantially equal to $Mf_{sc\ nom}/f_{ck\ nom}$ (e.g. $2^{18}$ in the present embodiment) by the sample scaler 354. The signal provided by the sample scaler 354 is added to the signal B by an adder 356 to develop the signal B'.

The following is a mathematical analysis of the circuitry 328'. From equations (13) and (4):

$$C'' = f_{ck\ nom}/f_{ck}. \tag{13}$$

and $$B = M(f_{sc\ nom} + \Delta f_{sc})/f_{ck\ nom} \tag{4}$$

the output signal B' of the adder 356 satisfies the equation:

$$B' = Mf_{sc\ nom}/f_{ck\ nom} + M\Delta f_{sc}/f_{ck\ nom} + (f_{ck\ nom}/f_{ck} - 1)(Mf_{sc\ nom}/f_{ck\ nom}). \tag{16}$$

This equation may be simplified to:

$$B' = Mf_{sc\ nom}/f_{ck\ nom} + M\Delta f_{sc}/f_{ck\ nom} + Mf_{sc\ nom}/f_{ck} - Mf_{sc\ nom}/f_{ck\ nom} \tag{17}$$

or $$B' = M(f_{sc\ nom}/f_{ck} + \Delta f_{sc}/f_{ck\ nom}). \tag{18}$$

This equation (17) approximates the equation (14).

As set forth above, the exact resonant frequency of the crystal 312 is unimportant for this circuitry. Consequently, a low tolerance crystal may be used with no manual adjustment to achieve a desired frequency or, alternatively, the oscillatory signal applied to the ADC 314 may be taken from an existing source, for example, a clock signal generator for a microprocessor used to control the television receiver.

What is claimed is:

1. In circuitry including a source of clock signal, the instantaneous frequency of which varies about a nominal clock frequency, and a first digital oscillator responsive to said clock signal and to a first frequency control signal for developing an output signal having a predetermined frequency wherein the variations in the frequency of said clock signal tend to cause corresponding variations in the frequency of said output signal, circuitry for substantially removing the variations in the frequency of said output signal comprising:
 means for developing a further reference signal having a substantially invariant frequency;
 a phase locked loop including:
  a second digital oscillator responsive to said clock signal and to a second frequency control signal for providing an oscillatory signal having substantially the same frequency as said reference signal wherein the variations in the frequency of said clock signal tend to cause corresponding variations in the frequency of said oscillatory signal; and means coupled to said source of reference signal for developing said second frequency control signal being proportional to the difference in phase between said reference signal and said oscillatory signal and tending to compensate said phase locked loop for the variations in the frequency of said oscillatory signal that are related to said clock signal;

means responsive to said second frequency control signal for developing a standard frequency control value representing the value of said second frequency control signal when the frequency of said clock signal is substantially equal to said nominal clock frequency;

means for combining said standard frequency control value and said second frequency control signal to generate a correction signal representing the variations in the frequency of said clock signal with respect to said nominal clock frequency and being substantially independent of said further reference signal; and means coupled to said correction signal developing means for modifying said first frequency control signal by said correction signal to substantially remove frequency instabilites in said output signal corresponding to frequency instabilites in said clock signal.

2. Apparatus comprising:
a terminal for applying a clock signal the instantaneous frequency of which varies about a nominal clock frequency;
a digital oscillator responsive to said clock signal and to a first frequency control signal for developing an output signal having a predetermined frequency, wherein the variations in the frequency of said clock signal tend to cause corrsponding variations in the frequency of said output signal;
means for developing a reference signal having a substantially invariant frequency;
a phase locked loop including:
a discret time oscillator responsive to said clock signal and to a second frequency control signal for providing an oscillatory signal that has substantially the same frequency as said reference signal, wherein the variations in the frequency of said clock signal tend to cause corresponding variations in the frequency of the signal provided by said discrete time oscillator; and
means including phase comparison means coupled to said source of reference signal and to said discrete time oscillator for developing said second frequency control signal representing the difference in phase between said reference signal and said oscillatory signal and tending to compensate said phase locked loop for the variations in the frequency of said oscillatory signal that are related to said clock signal;
means responsive to said second frequency control signal for developing a standard frequency control value representing the value of said second frequency control signal when the frequency of said clock signal is substantially equal to said nominal clock frequency;
means for combining said standard frequency control value and said second frequency control signal to generate a correction signal representing the variations in the frequency of said clock signal with respect to said nominal clock frequency and being substantially independent of said reference signal; and combining means coupled to said correction signal developing means for combining said first frequency control signal and said correction signal to produce a modified first frequency control signal for application to said digital oscillator to substantially remove the variations in the frequency of said output signal that are related to said clock signal.

3. The apparatus set forth in claim 2 wherein said correction signal developing means includes signal dividing means having a first input port coupled to receive said second frequency control signal, a second input port coupled to receive said standard frequency control value and an output port for providing said correction signal to said combining means.

4. The apparatus set forth in claim 2 wherein:
said correction signal is substantially equal to the ratio of said nominial clock frequency to the frequency of said clock signal; and
said combining means includes a multiplier for developing said modified first frequency control signal, being substantially equal to the product of said first frequency control signal and said correction signal.

5. The apparatus set forth in claim 2 wherein:
said correction signal is substantially equal to the ratio of said nominal clock frequency to the frequency of said clock signal; and
said combining means includes:
a subtractor for subtracting unity from said correction signal;
scaling means for multiplying the signals provided by said subtractor by a predetermind value; and
an adder for adding the signal provided by said scaling means to said first frequency control signal to produce a modified first frequency control signal which approximates the product of said first frequency control signal and said correction signal.

6. Apparatus comprising:
a terminal for applying a clock signal which exhibits frequency instabilities;
a digital oscillator responsive to said clock signal and to a first frequency control signal for developing an output signal having a predetermined frequency, wherein the frequency instabilites in said clock signal tend to cause corresponding frequency instabilites in said output signal;
means for developing a reference signal having a substantially invariant frequency;
a phase locked loop including:
a discrete time oscillator responsive to said clock signal and to a second frequency control signal for providing an oscillatory signal that has substantially the same frequency as said reference signal, wherein the frequency instabilities in said clock signal tend to cause corresponding frequency instabilities in the signal provided by said discrete time oscillator; and
means including phase comparison means coupled to said source of reference signal and to said discrete time oscillator for developing said second frequency control signal representing the difference in phase between said reference signal and said oscillatory signal and tending to compensate said phase locked loop for the frequency instabilities in said oscillatory signal that are related to said clock signal;

combining means, coupled to receive a correction signal, for combining said correction signal and said first frequency control signal to produce a modified first frequency control signal for application to said digital oscillator to substantially remove the variations in the frequency of said output signal that are related to said clock signal; and means for developing said correction signal including:

sample storage means having an input port coupled to receive said second frequency control signal and an output port and responsive to a sample storage control signal being in a predetermined state for storing selected samples of said second frequency control signal;

means coupled to said combining means for developing said sample storage control signal including means for changing the sample storage control signal to said predetermined state and means for comparing the signal provided by said combining means against a predetermined value and means for changing the sample storage control signal to a state other than said predetermined state when said modified first frequency control signal has a predetermined relationship to said predetermined value; and signal dividing means having a first input port coupled to receive said second frequency control signal, a second input port coupled to the output port of said sample storage means and an output port for providing said correction signal to said combining means.

7. The apparatus set forth in claim 6 wherein:

said predetermined value corresponds to the value of said modified first frequency control signal when the frequency of said clock signal is substantially equal to said nominal clock frequency;

said sample storage control signal developing means changes said sample storage control signal from said predetermined state to said state other than said predetermined state when said modified first frequency control signal is substantially equal to said predetermined value to condition said sample storage means to store a sample representing the value of said second frequency control signal when the frequency of said clock signal is substantially equal to said nominal clock frequency; and said signal dividing means provides said correction signal being substantially equal to said second frequency control signal divided by the value of the sample stored in said sample storage means.

8. A digital television signal processing system comprising:

an input terminal for applying composite video signals including horizontal line synchronizing signal components and chrominance signal components including a color reference burst signal component;

a first phase locked loop responsive to said composite video signals and having a predetermined loop time constant for generating a sampling clock signal that is locked in phase to said horizontal line synchronizing signal components, wherein the instantaneous frequency of said sampling clock signal varies about a nominal clock frequency;

a second digital phase locked loop, responsive to said clock signal and to said composite video signals and having a loop time constant that is substantially greater than that of the first phase locked loop for developing an output signal having substantially the same frequency as the color reference burst signal component of said composite video signals, wherein said output signal tends to exhibit variations in frequency that are related to the variations in the frequency of said clock signal;

means for developing a reference signal having a substantially invariant frequency;

a third phase locked loop, responsive to said reference signal and to said clock signal and having a loop time constant that is not significantly greater than that of said first phase locked loop, for developing an ocillatory signal that has substantially the same frequency as said reference signal and that tends to exhibit variations in frequency that are related to the variations in the frequency of said clock signal, wherein said third phase locked loop includes circuitry for developing a compensating control signal, proportional to the differences in frequency between said reference signal and said oscillatory signal said compensating control signal corresponding to the variations in the frequency of said clock signal, to condition said third phase locked loop to substantially compensate for the variations in the frequency of said oscillatory signal that are related to said clock signal;

means coupled to said third phase locked loop and responsive to said compensating control signal for developing a standard frequency control value representing the value of said compensating control signal when the frequency of said clock signal is substantially equal to said nominal clock frequency;

combining means for combining said standard frequency control value and said compensating control signal to generate a correction signal representing the variations in the frequency of said clock signal with respect to said nominal clock frequency, wherein said correction signal is substantially independent of said reference signal; and compensating means coupled to said second phase locked loop and responsive to said correction signal for substantially compensating said second phase locked loop for the variations in the frequency of said output signal which are related to said clock signal.

9. The television signal processing system set forth in claim 8 wherein:

said second phase locked loop includes a digital oscillator responsive to said clock signal and to a frequency control signal for developing said output signal having substantially the same frequency as the color reference burst signal component of said composite video signals wherein the variations in the frequency of said clock signal tend to cause corresponding variations in the frequency of said output signal;

said means for developing said reference signal includes:

a crystal oscillator for developing an output signal having said substantially invariant frequency;

an analog to digital converter coupled to said crystal oscillator and responsive to said clock signal for developing digital samples representing said reference signal and having values corresponding to the signal provided by said crystal oscillator at instants determined by said clock signal; and said third phase locked loop includes:
- a discrete time oscillator responsive to said clock signal and to said compensating control signal for developing said oscillatory signal having substantially the same frequency as said reference signal, wherein the variations in the frequency of said clock signal tend to cause corresponding variations in the frequency of said oscillatory signal; and
- means including phase comparison means coupled to said discrete time oscillator and responsive to said reference signal for developing said compensating control signal representing the difference in phase between said reference and oscillatory signals;

said combining means includes signal dividing means having a first input port coupled to receive said compensating control signal, a second input port coupled to receive said standard frequency control value and an output port for providing said correction signal to said compensating means; and said compensating means includes means coupled to said combining means for developing a signal which approximates the product of said frequency control signal and said correction signal for application to said digital oscillator as a modified frequency control signal.

10. The television signal processing system set forth in claim 9 wherein said means for developing said standard frequency control value further includes:
- sample storage means having an input port coupled to receive said compensating control signal and an output port coupled to the second input port of said signal dividing means and responsive to a sample storage control signal being in a predetermined state for storing selected samples of said compensating control signal; and
- means coupled to said means for compensating said second phase locked loop for developing said sample storage control signal including means for changing said sample storage control signal to said predetermined state and means for comparing said modified frequency control signal against a predetermined value and means for changing the sample storage control signal to a state other than said predetermined state when said modified frequency control signal is in a predetermined relationship with said predetermined value.

11. The telvision signal processing system set forth in claim 10 wherein:
- said predetermined value corresponds to the value of said modifed frequency control signal when the frequency of said clock signal is substantially equal to said nominal clock frequency;
- said sample storage control signal developing means changes said sample storage control signal to said state other than said predetermined state when said modified frequency control signal is substantially equal to said predetermined value to condition said sample storage means to store a sample representing the value of said second control signal when the frequency of said clock signal is substantially equal to said nominal clock frequency; and
- said signal dividing means provides a signal substantially equal to said frequency control signal divided by the value of the sample provided by said sample storage means.

12. The television signal processing system set forth in claim 8 wherein:
- said correction signal is substantially equal to the ratio of said nominal clock frequency to the frequency of said clock signal; and
- said means for compensating said second phase locked loop includes a multiplier for developing a modified frequency control signal that is substantially equal to the product of said frequency control signal and said correction signal.

13. The television signal processing system set foth in claim 8 wherein:
- said correction signal is substantially equal to the ratio of said nominal clock frequency to the frequency of said clock signal; and
- said means for compensating said second phase locked loop includes:
  - a subtractor for subtracting a value of unity from said correction signal;
  - scaling means for multiplying the signals provided by said subtractor by a predetermined value; and
  - an adder for adding the signal provided by said scaling means to said frequency control signal to produce a modified frequency control signal which approximates the product of said frequency control signal and said correction signal.

* * * * *